(12) United States Patent
Leeser

(10) Patent No.: US 10,345,802 B2
(45) Date of Patent: Jul. 9, 2019

(54) COMMON TERMINAL HEATER FOR CERAMIC PEDESTALS USED IN SEMICONDUCTOR FABRICATION

(71) Applicant: Lam Research Corporation, Fremont, CA (US)

(72) Inventor: Karl Leeser, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 241 days.

(21) Appl. No.: 15/046,232

(22) Filed: Feb. 17, 2016

(65) Prior Publication Data

US 2017/0236733 A1   Aug. 17, 2017

(51) Int. Cl.
*G05B 24/02* (2006.01)
*H01L 21/67* (2006.01)
(Continued)

(52) U.S. Cl.
CPC .......... *G05B 24/02* (2013.01); *C23C 16/4557* (2013.01); *C23C 16/4586* (2013.01); *C23C 16/45544* (2013.01); *C23C 16/45565* (2013.01); *C23C 16/46* (2013.01); *C23C 16/52* (2013.01); *G05B 13/021* (2013.01);
(Continued)

(58) Field of Classification Search
CPC ............... G05B 24/02; H01J 37/32724; H01L 21/67109; H01L 21/67248
See application file for complete search history.

(56) References Cited

U.S. PATENT DOCUMENTS 4,697,068 A * 9/1987 Schreder .................. H05B 3/76
219/448.19
5,650,082 A * 7/1997 Anderson ............. C23C 16/481
118/725
(Continued)

OTHER PUBLICATIONS

"Current and Resistance", Boston University (1999): pp. 1-6 (http://physics.bu.edu/~duffy/PY106/Resistance.html).*

*Primary Examiner* — Michele Fan
(74) *Attorney, Agent, or Firm* — Penilla IP, APC

(57) ABSTRACT

System and methods for processing a substrate using a reactor with multiple heating zones and control of said heating zones using a common terminal shared between two power supplies are provided. The reactor includes a heater assembly for supporting the substrate and a showerhead for supplying process gases into the reactor. An inner heater and an outer heater are integrated in the heater assembly. An inner power supply has a positive terminal connected to a first end of the inner heater and a negative terminal is connected to a second end of the inner heater that is coupled to a common terminal. An outer power supply has a positive terminal connected to a first end of the outer heater and a negative terminal connected to a second end of the outer heater that is coupled to the common terminal. A common-terminal heater module is configured to receive a measured temperature that is proximate to the inner heater. A desired temperature setting is received and a servo control law is processed to identify a direct control setting of an inner voltage of the inner power supply and an open-loop control setting of an outer voltage for the outer power supply. The outer voltage is defined as a ratio of the inner voltage.

23 Claims, 8 Drawing Sheets

(51) Int. Cl.
    *C23C 16/455*     (2006.01)
    *C23C 16/458*     (2006.01)
    *C23C 16/52*     (2006.01)
    *H01J 37/32*     (2006.01)
    *C23C 16/46*     (2006.01)
    *G05B 13/02*     (2006.01)

(52) U.S. Cl.
    CPC .. *H01J 37/32009* (2013.01); *H01J 37/32522* (2013.01); *H01J 37/32724* (2013.01); *H01L 21/67109* (2013.01); *H01L 21/67248* (2013.01); *H01J 2237/334* (2013.01)

(56) References Cited

U.S. PATENT DOCUMENTS

| | | | |
|---|---|---|---|
| 2005/0061796 A1* | 3/2005 | Higgins | H05B 3/748 219/460.1 |
| 2008/0237216 A1* | 10/2008 | Goto | H01L 21/67103 219/461.1 |
| 2009/0314208 A1 | 12/2009 | Zhou et al. | 118/723 R |
| 2009/0314762 A1* | 12/2009 | Cui | H01L 21/67103 219/444.1 |
| 2010/0206865 A1* | 8/2010 | Jaccard | A47J 31/44 219/438 |
| 2011/0139070 A1* | 6/2011 | Nabeta | H01J 37/32082 118/666 |
| 2012/0103970 A1 | 5/2012 | Lubomirsky et al. | 219/460.1 |
| 2012/0171377 A1* | 7/2012 | Volf | H01L 21/68757 427/255.28 |
| 2012/0211484 A1 | 8/2012 | Zhou et al. | 219/448.11 |

* cited by examiner $$V_i = k_p (T_{id} - T_j) + k_0 \frac{d}{dt}(T_{id} - T_j) + k_I \int (T_{id} - T_j)dt$$

$$V_o = k V_i$$

$$V1 = k_p (T_{id} - T_j) + k_0 \frac{d}{dt}(T_{id} - T_j) + k_I \int (T_{id} - T_j)dt$$

$$V2 = k V1$$

A- First End of Inner Heater
B- First End of Outer Heater
C- Second End of Inner Heater Connected to Second End of Outer Heater

COMMON TERMINAL HEATER FOR CERAMIC PEDESTALS USED IN SEMICONDUCTOR FABRICATION

BACKGROUND

1. Field of the Disclosure

The present embodiments relate to semiconductor substrate processing methods and equipment tools, and more particularly, heater assembly designs that utilize multiple heaters and a common terminal to reduce wiring to the heater assembly.

2. Description of the Related Art

Reactors having pedestals with multiple heaters are typically used to enable precision control of the surface of the pedestal during processing of a substrate in the reactor. Two zone heaters in pedestals conventionally have two electrical terminals per heater, or four terminals total. Each of these terminals needs to be wired through the base of the pedestal and into connections of resistive elements that are integrated into the pedestal. Two zone heaters in pedestals offer the ability to tune radial temperature profile as well as to compensate for variable environmental thermal loss conditions such as process kit emissivity change (wafer count-based) or for heat transfer conditions that are different between different process steps (state-based).

As the design of pedestals and associated reactors continue to improve, more control is provided by way of circuitry, wiring, and other interfacing components. Unfortunately, this increase in wiring can lead to undesired complexity in the interconnections made to the pedestal. Thus, simplification of wiring requirements through the base of the pedestal and in the pedestal are needed to reduce cost, complexity and design, and reduce additional points of failure.

It is in this context that disclosures arise.

SUMMARY

Embodiments of the disclosure include the use of reactor pedestals that have multiple heaters and use common terminals to reduce a number of wires required to interconnect the multiple heaters in a pedestal to respective power supplies. Various embodiments described herein, a pedestal of a reactor is only one example in which heaters can be implemented. As such, the interconnection topography and logic described herein is applicable to any type of heater assembly. Such heater assemblies can be defined in a pedestal of a reactor, and often are also defined in a showerhead of a reactor, so as to control showerhead temperature. It should be understood that heater assemblies can be integrated into different components of a chamber, process module, reactor, interfacing chamber, or other component.

In one embodiment, a system for processing a substrate is disclosed. The system includes a reactor including a heater assembly for supporting the substrate. Two or more heaters are integrated into the heater assembly, and the two or more heaters include a first heater and a second heater. A common-terminal heater module is configured to receive a measured temperature that is proximate to the first heater of the heater assembly. The common-terminal heater module is configured to receive a desired temperature setting and a servo control law is processed to identify a direct control setting of a first voltage for the first heater and an open-loop control setting of a second voltage for the second heater which is derived as a ratio of the first voltage.

In one embodiment, a system for processing a substrate using a reactor with dual heating zones is provided. Control of said heating zones uses a common terminal shared between two power supplies. The reactor includes a pedestal for supporting the substrate and a showerhead for supplying process gases into the reactor. An inner heater and an outer heater are integrated in the pedestal. An inner power supply has a positive terminal connected to a first end of the inner heater and a negative terminal is connected to a second end of the inner heater that is coupled to a common terminal. An outer power supply has a positive terminal connected to a first end of the outer heater and a negative terminal connected to a second end of the outer heater that is coupled to the common terminal. A common-terminal heater module is configured to receive a measured temperature that is proximate to the inner heater. A desired temperature setting is received and a servo control law is processed to identify a direct control setting of an inner voltage of the inner power supply and an open-loop control setting of an outer voltage for the outer power supply. The outer voltage is defined as a ratio of the inner voltage.

In some embodiments, the servo control law processes a closed loop analysis of a difference between the desired temperature and the measured temperature from the inner heater.

In some embodiments, the closed loop analysis is configured to iterate until the measured temperature is equal to the desired temperature, the closed loop analysis is configured to identify the inner voltage of the inner power supply that is used as the direct control setting.

In some embodiments, the ratio is selected to cause the outer heater to approximately reach the desired temperature setting, such that approximate uniformity in temperature across the inner heater and outer heater is provided for processing the substrate when disposed over the pedestal of the reactor.

In some embodiments, each of the inner and outer heaters is defined from a resistive element, and a resistive value of each resistive element changes as a function of temperature.

In some embodiments, each of the negative terminal of the inner power supply, the negative terminal of the outer power supply, the second end of the inner heater, and the second end of the outer heater are connected to a joining node of the common terminal.

In some embodiments, the common terminal reduces connections from both the inner power supply and the outer power supply to the inner heater and outer heater to three wire connections.

In some embodiments, the second end of the inner heater and the second end of the outer heater are electrically connected at the joining node of the common terminal.

In some embodiments, a temperature sensor disposed in the pedestal proximate to the inner heater is used to obtain the measured temperature of the pedestal in a vicinity of the inner heater. The pedestal is defined from a ceramic material and the inner heater and the outer heater being defined from resistive elements. The resistive elements are configured to change their resistive value as a function of temperature. In one embodiment, the measured resistance is used to indicate the temperature of that zone.

In some embodiments, the common terminal is defined outside of the pedestal, such that the inner heater and the outer heater are controlled by three connections made to the inner power supply and the outer power supply.

In some embodiments, the ratio is proportioned to compensate for a difference in a length of a resistive element of the outer heater and a length of a resistive element of the inner heater.

In some embodiments, the proportion of the ratio further compensates for a difference in area of the pedestal that includes the resistive element of the outer heater verses the resistive element of the inner heater.

In some embodiments, the ratio is predefined to achieve a substantially uniform heat profile across a surface of the pedestal. The direct control setting of the inner voltage of the inner power supply is identified using a temperature sensor disposed in the pedestal proximate to the inner heater to identify the measured temperature and no temperature sensor is used to measure temperature proximate to the outer heater.

In some embodiments, the ratio is settable by a controller of the reactor. The specific settings of the ratio achieve differences in heat profiles of the pedestal produced by the outer heater verses the inner heater, wherein the direct control setting of the inner voltage of the inner power supply is identified using a temperature sensor disposed in the pedestal proximate to the inner heater to identify the measured temperature and no temperature sensor is used to measure temperature proximate to the outer heater.

In one embodiment, a method for controlling heater zones of a pedestal used in a reactor implemented for processing substrates is disclosed. The method includes connecting a first terminal of a first power supply to a first end of an inner heater of the pedestal, connecting a first terminal of a second power supply to a first end of an outer heater of the pedestal, connecting a second end of the inner heater and the second end of the outer heater to a common terminal. The method further includes connecting the second terminal of the first power supply and the second terminal of the second power supply to the common terminal. The inner and outer heaters of the pedestal are controlled with the first terminal of the first power supply, the first terminal of the second power supply, and the common terminal. The method is configured to obtain a measured temperature of the pedestal proximate to the inner heater. The method uses a servo control law to identify a direct control setting of an inner voltage of the first power supply so that a desired temperature matches the measured temperature. Then, an open-loop control setting is identified for an outer voltage of the second power supply. The outer voltage is a multiple of the inner voltage, so that the multiple is defined by a ratio.

In some embodiments, connections to the pedestal for the inner and outer heaters is limited to the first terminal of the first power supply, the first terminal of the second power supply, and the common terminal. The common terminal is shared by the first and second power supplies.

In some embodiments, processing the servo control law includes executing a closed loop analysis of a difference between the desired temperature and the measured temperature from the inner heater.

In some embodiments, the closed loop analysis is configured to iterate until the measured temperature is equal to the desired temperature, the closed loop analysis is configured to identify the direct control setting of the inner voltage of the first power supply.

In some embodiments, the ratio is selected to cause the outer heater to approximately reach the desired temperature setting, such that approximate uniformity in temperature across the inner heater and outer heater is provided for processing the substrate when disposed over the pedestal of the reactor.

In some embodiments, the ratio is settable by a controller of the reactor. Specific settings of the ratio achieve differences in heat profiles of the pedestal produced by the outer heater verses the inner heater. The direct control setting of the inner voltage of the inner power supply is identified using a temperature sensor disposed in the pedestal proximate to the inner heater to identify the measured temperature and no temperature sensor is used to measure temperature proximate to the outer heater.

These and other advantages will be appreciated by those skilled in the art upon reading the entire specification and the claims.

DESCRIPTION

Embodiments of the disclosure provide examples of reactor systems that utilize multiple heaters to control the temperature of the pedestal used during processing of a substrate. Example embodiments are provided for systems and methods that enable the use of a common terminal to reduce the number of wires required to interconnect multiple heaters in a pedestal to respective power supplies. The common terminal embodiments described herein enable a reduction in wiring that is required to be routed into a pedestal of a reactor. Reducing the number of wires and connections into a pedestal reduces the complexity of the pedestal design, reduces the number of connection points, and may increase the reliability of the reactor. Further, embodiments described herein utilize a method for utilizing a single temperature sensor to measure the temperature associated with one of the heater zones in the pedestal. The single measurement is then used as an input to a servo control law to identify a voltage setting that is required to achieve a desired temperature for that measured heater.

Resistive elements that define the heaters which are integrated in a pedestal, e.g. ceramic pedestal, are known to change in resistance based on temperature. For this reason, the servo control law can be utilized to identify the voltage that would place the temperature of the sensed zone in the proper temperature. Once the voltage setting is identified for the heater zone that is being measured, a ratio value is utilized to derive the voltage that should be set for the other heater or heaters to achieve uniformity in heating across the pedestal. In some embodiments, the ratio can be adjusted so that custom differences in temperature can be achieved between the heaters, e.g., enabling different temperatures for different zones.

In some embodiments, the heaters described as being integrated into the pedestal can also be integrated into other components of a reactor. For example, the heaters can be integrated into a showerhead of the reactor, so as to define a heated showerhead. Broadly speaking, description provided here in regarding a pedestal and heaters integrated in the pedestal can also apply to other types of heating assemblies. Such heating assemblies, as noted, can include a showerhead, and electrostatic chuck, a support chuck, a pedestal, chamber components, or other structures that may be implemented in reactors and process modules used for processing substrates, such as semiconductor substrates and other devices.

Figure 1A:
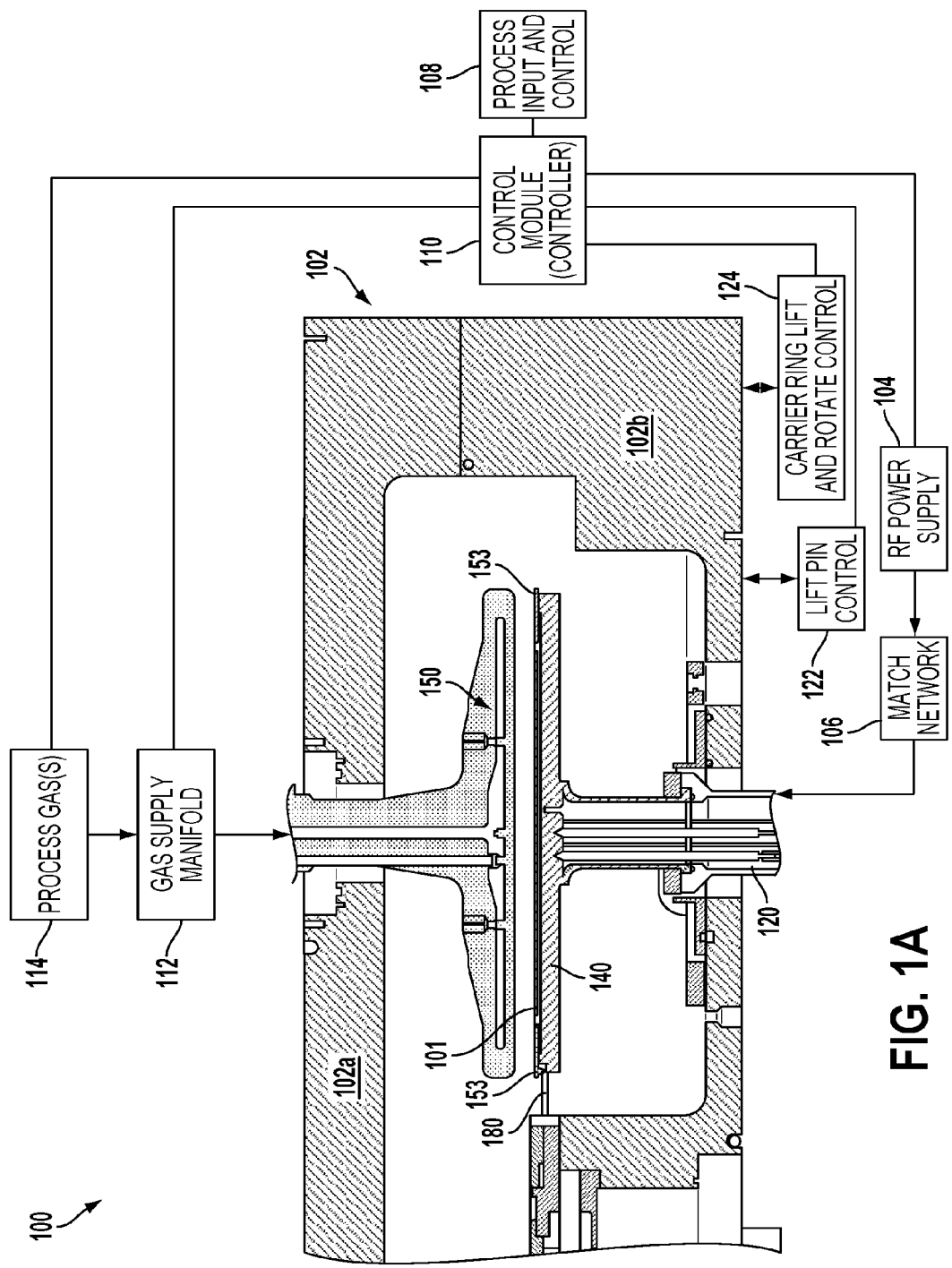
FIG. 1A illustrates a substrate processing system, which is used to process a substrate, e.g., to form films thereon.

FIG. 1A illustrates a reactor system 100, which may be used to deposit films over substrates, such as those formed in atomic layer deposition (ALD) processes. These reactors may utilize two or more heaters, and the common terminal configurations may be used in this example reactor to control the temperatures for uniformity or custom settings.

With this in mind, the system of FIG. 1A includes a chamber 102 having a lower chamber portion 102b and an upper chamber portion 102a. A center column is configured to support a pedestal 140, which in one embodiment is a powered electrode. The pedestal 140 is electrically coupled to power supply 104 (e.g., RF power source) via a match network 106. The power supply 104 may be defined from a single generator having two or more selectable and mutually exclusive oscillators. The power supply 104 is controlled by a control module 110, e.g., a controller. The control module 110 is configured to operate the substrate processing system 100 by executing process input and control 108. The process input and control 108 may include process recipes, such as power levels, timing parameters, shuttle speed, RF power levels, ground settings, process gasses, flow rates, mechanical movement of the substrate 101, etc., such for ALD film deposition over the substrate 101.

The center column or stem is also shown to include lift pins 120, which are controlled by lift pin control 122. The lift pins 120 are used to raise the substrate 101 from the pedestal 140 to allow an end-effector to pick the substrate and to lower the substrate 101 after being placed by the end-effector. The substrate processing system 100 further includes a gas supply manifold 112 that is connected to process gases 114, e.g., gas chemistry supplies from a facility. Depending on the processing being performed, the control module 110 controls the delivery of process gases 114 via the gas supply manifold 112. The chosen gases are then flown into the shower head 150 and distributed in a space volume defined between the showerhead 150 face which faces that substrate 101 and the substrate 101 resting over the pedestal 140. In ALD processes, the gases can be reactants chosen for absorption or reaction with absorbed reactants.

Further, the gases may be premixed or not. Appropriate valving and mass flow control mechanisms may be employed to ensure that the correct gases are delivered during the deposition and plasma treatment phases of the process. Process gases exit the chamber via an outlet. A vacuum pump (e.g., a one or two stage mechanical dry pump and/or a turbomolecular pump) draws process gases out and maintains a suitably low pressure within the reactor by a close loop controlled flow restriction device, such as a throttle valve or a pendulum valve.

Also shown is a carrier ring 153 that encircles an outer region of the pedestal 140. The carrier ring 153 is configured to sit over a carrier ring support region that is a step down from a substrate support region in the center of the pedestal 140. The carrier ring includes an outer edge side of its disk structure, e.g., outer radius, and a substrate edge side of its disk structure, e.g., inner radius, that is closest to where the substrate 101 sits. The substrate edge side of the carrier ring includes a plurality of contact support structures which are configured to lift the substrate 101 when the carrier ring 153 is lifted by forks 180. The carrier ring 153 is therefore lifted along with the substrate 101 and can be rotated to another station, e.g., in a multi-station system. In other embodiments, the chamber is a single station chamber.

Figure 1B:
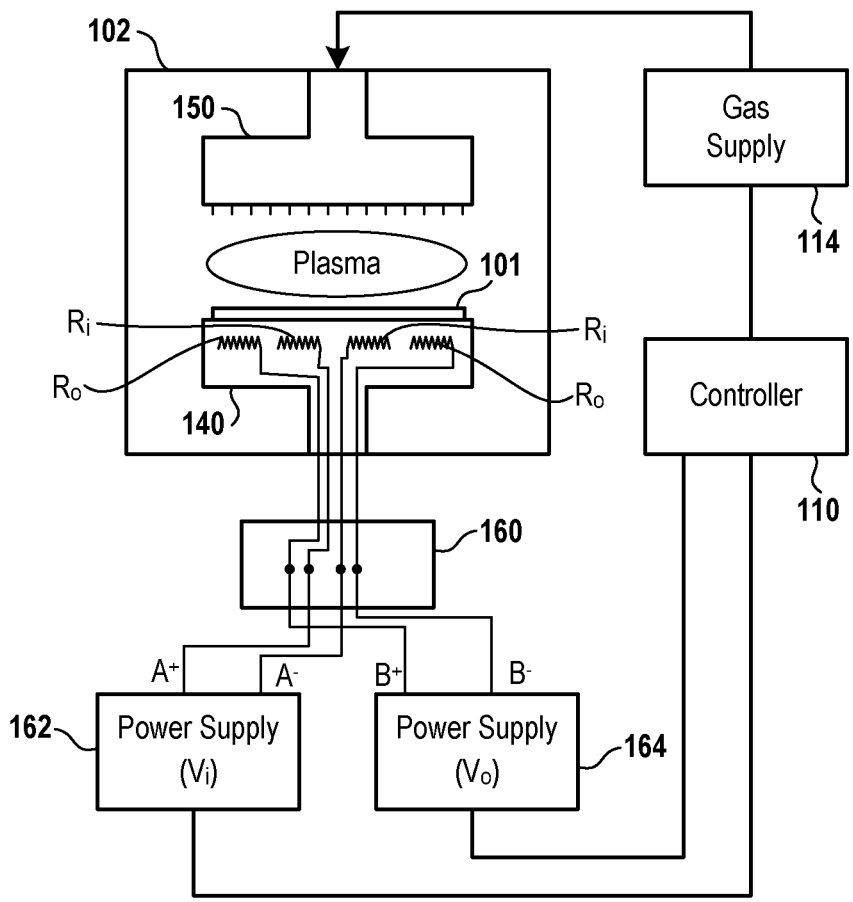
FIG. 1B illustrates a system diagram of the reactor utilized for processing a semiconductor substrate.

FIG. 1B illustrates a system diagram of the reactor 102 utilized for processing a semiconductor substrate 101. The semiconductor substrate 101 is shown disposed over pedestal 140 in the reactor 102. A showerhead 150 is used to supply process gases utilized to create and generate a plasma in the reactor 102. Gas supply 114 supplies one or more gases depending on process recipes to the showerhead 150. The controller 110 is used to provide instructions to the various components of the reactor 102, including facilities such as gas supply 114, pressure controls, temperature controls, and other processing parameters. In this example, the controller 110 is coupled to power supply 162 and power supply 164. Power supply 162 is configured to supply power to an inner heater disposed in the pedestal 140. Power supply 164 is configured to supply power to the outer heater disposed in the pedestal 140.

Wiring connections 160 provide the connection interfaces between the power supply 162 and the power supply 164 to the heaters of the pedestal 140. The heaters in the pedestal 140 are illustrated by resistive elements, which are respectively identified as Ro for the resistive elements of the outer heater, and Ri for the resistive elements of the inner heater. Generally speaking, the power supply 162 is capable of controlling the voltage Vi of the inner heater to influence a change in temperature of the pedestal 140 in a region proximate to the placement of the inner resistive elements Ri. The power supply 164 is capable of controlling the voltage Vo of the outer heater to influence a change in temperature of the pedestal 140 in a region proximate to the placement of the outer resistive elements Ro.

Figure 2:
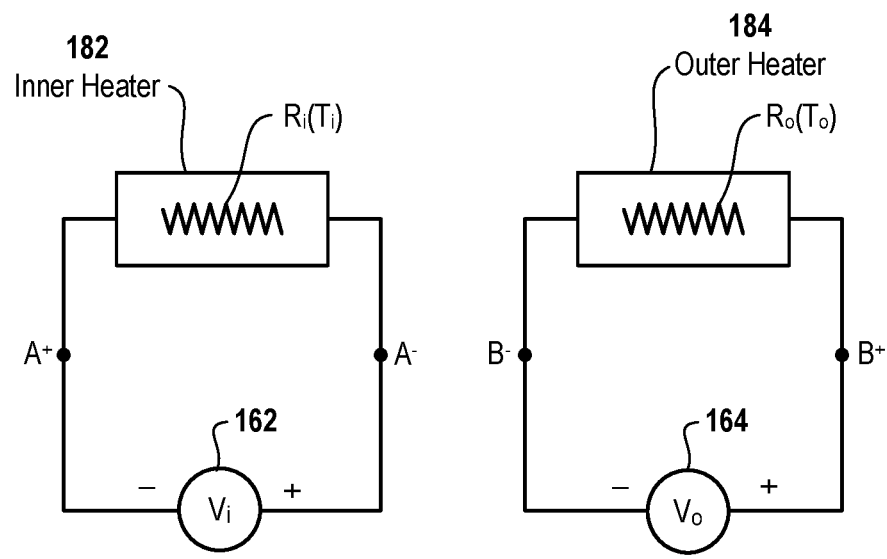
FIG. 2 illustrates an example of the separate nature of the power supplies, when connected to the inner heater and the outer heater, respectively.

FIG. 2 illustrates an example of the separate nature of the power supplies 162 and 164, when connected to the inner heater 182 and the outer heater 184, respectively. In this configuration, it is possible to more accurately control the inner heater 182 and the outer heater 184 separately, because separate terminal connections are provided independently to each of the power supplies 162 and 164. This configuration requires that the positive and negative connections A+ and A− of the inner heater 182 are channeled to the pedestal 144 for making connections to the resistive element Ri. Similarly, the positive and negative connections B+ and B− of the outer heater 184 are channeled to the pedestal 140 for making connections to the resistive element Ro.

Although this configuration allows for control of the inner and outer heaters separately, the wiring connections 160 that must be routed to the pedestal 140 and interconnected to the resistive elements Ro and Ro, require additional routing within the pedestal 140 and also interconnection to the resistive elements of the pedestal 140, which complicates the wiring and complexity of the routing design for the wiring connections 160.

As can be appreciated, additional wiring added to a pedestal can add complexity as well as cost. Reducing the number of connections made to the pedestal 140 will therefore simplify the pedestal 140 design. The following examples will illustrate the use of a common terminal for connecting an inner and an outer heater of a pedestal to separate power supplies, while reducing the number of wiring connections made to the pedestal and integrated to the resistive elements disposed in the pedestal. These examples will now be described with reference to FIGS. 3A-7.

Figure 3A:
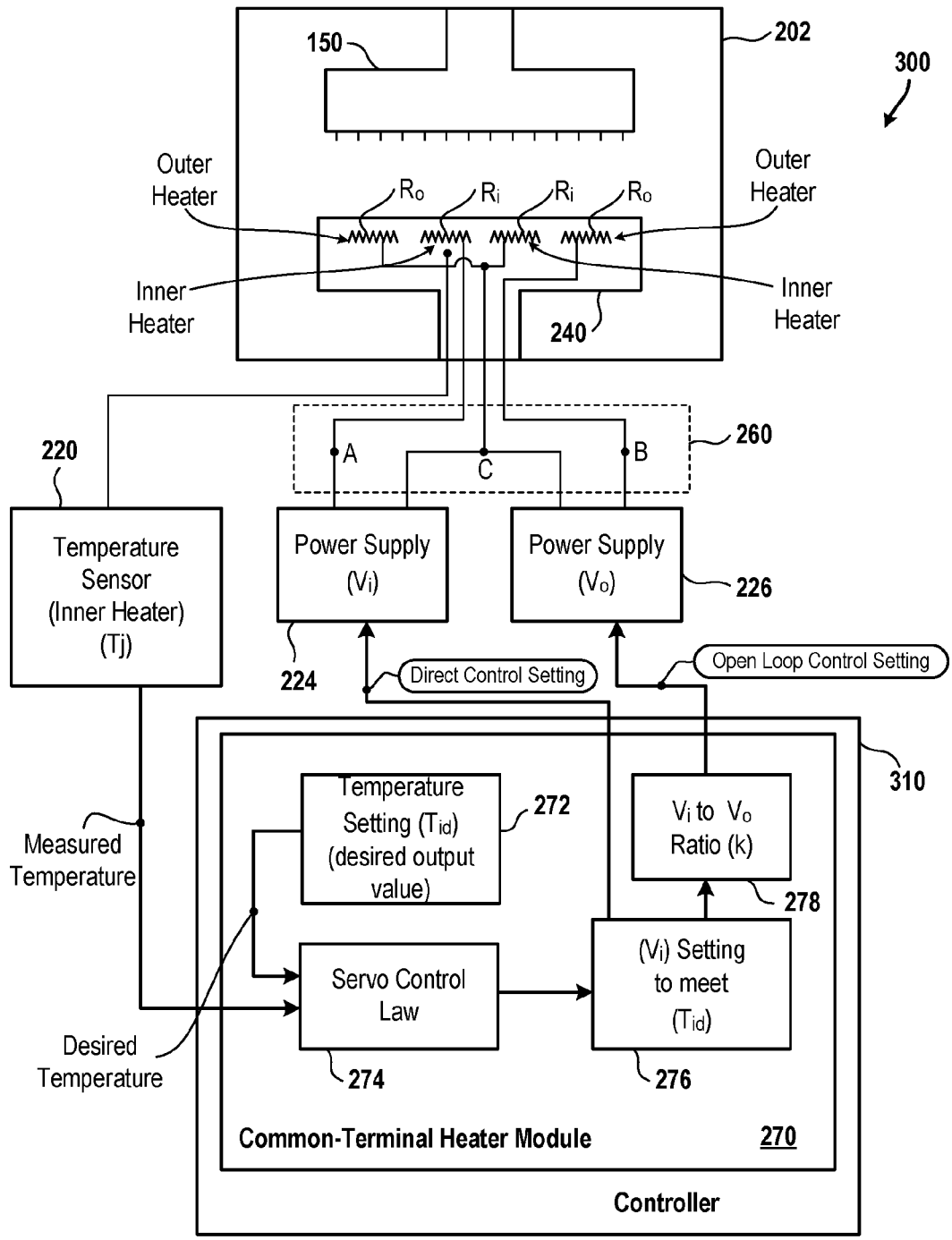
FIG. 3A illustrates an example of a system, that includes the reactor interfaced with power supplies for delivering power to the inner and outer heaters disposed in a pedestal of a reactor.

FIG. 3A illustrates an example of a system 300, that includes the reactor 202 interfaced with power supplies 224 and 226 for delivering power to the inner and outer heaters disposed in a pedestal 240 of the reactor 202. In this example, a common terminal C is used to interconnect connections between power supply 224 and power supply 226 to the resistive elements that define the heaters of the pedestal 240. As shown, the pedestal 240 includes resistive elements Ro and Ri, respectively referencing the resistive elements of the outer heater Ro and the resistive elements of the inner heater Ri. An electrical connection is made from the power supply 224 to the inner heater by way of a positive terminal A that is interconnected to a first end of the inner heater.

A negative terminal of the power supply 224 is connected to the common terminal C. An electrical connection is made from the power supply 226 to the outer heater by way of a positive terminal B that is interconnected to a first end of the outer heater. A negative terminal of the power supply 226 is connected to the common terminal C. In this manner, only three wiring connections between the first power supply 224 and the second power supply 226 are made from connections 260 up into the pedestal 240 and coupling to the resistive elements Ro and Ri of the respective heaters.

The first power supply 224 is connected to the inner heater having resistive elements Ri, and the first power supply 224 has an inner voltage (Vi) which is a setting of the power supply 224. The second power supply 226 is connected to the outer heater having resistive elements Ro, and the second power supply 226 has an outer voltage (Vo) which is a setting of the power supply 226.

A common-terminal heater module 270 is provided for setting the inner voltage Vi and the outer voltage Vo, when the common terminal connections are made to the nodes A, C and B. Further shown is a temperature sensor 220 that is routed into the pedestal 240 to enable direct measurement of temperature (Tj) in a region that is proximate to the inner heater, defined by the inner resistive element Ri. In one embodiment, a thermocouple can be disposed in the pedestal 240 in a location proximate to the inner heater, so that the temperature of the pedestal in the location that is proximate to the inner heater can be measured, defining a measured temperature of the pedestal 240. In one embodiment, the pedestal that includes the resistive elements is made from a ceramic material.

The heat produced by the resistive elements is therefore transferred to the ceramic material of the pedestal 240. In one embodiment, the pedestal 240 is defined from the ceramic material in the region where the resistive elements are disposed, and further the ceramic material defines a surface onto which a substrate will be disposed when present in the reactor 202. In some configurations, the pedestal 240 can have other components, such as the stem which may not be defined from a ceramic. The stem of the pedestal 240 may be defined from a metal, such as aluminum, stainless steel, or other materials. The stem will preferably have disposed therein channels for routing wires into and making connections to the connection nodes in the pedestal 240, for connecting to the resistive elements.

The resistive elements, in one embodiment, are fabricated and formed inside of the ceramic material. In some embodiments, the pedestal 240 is defined from more than one layer of ceramic material powder, which is then sandwiched together to encase the resistive elements and the connections to the resistive elements. In other embodiments, the ceramic material of the pedestal can be formed, such that the resistive elements are disposed inside of the ceramic material. Generally, the ceramic material is capable of transferring heat from the heater to the bulk of the ceramic material, thus transferring and producing the heat level to the surface of the pedestal 240, which is then placed proximate to the substrate during processing. In general, the resistive elements are configured to change in resistance as a function of temperature R(T). Thus, when power is provided to the resistive elements, the resistance will change as a function of the temperature change produced by the resistive elements, and the voltage provided by the power supplies. In one embodiment, the measured resistance is used to indicate the temperature of that zone.

In one embodiment, the common-terminal heater module 270 includes logic for receiving a desired temperature as a temperature setting 272 Tid. The measured temperature Tj of the inner heater is then communicated to a servo control law 274, as well as the temperature setting Tid. The servo control law 274 is configured to perform an iterative process that continuously changes the inner voltage Vi until the difference between the measured temperature Tj and the temperature setting Tid reach substantially zero. The servo control law 274 therefore changes the inner voltage Vi gradually until the measured temperature Tj equals the desired temperature Tid of the inner heater.

By way of example, the servo control law 274 presumes direct measurement of the temperature of the inner zone. The outer zone control signal (voltage) is coupled to the inner zone via a ratio k. Therefore, the inner zone is controlled by a servo control law and the outer zone is controlled open loop (on temperature). In another embodiment, if a direct temperature measurement were made of the outer zone, then both the inner and outer zones could be controlled by servo controllers, but the optimum way of control would be to preserve servo control of temperature (which could be the inner zone temperature or the average temperature) by the inner zone and the outer zone would control temperature non-uniformity (e.g., the difference between the outer and inner zones, To−Tj). In one embodiment, the average temperature is mathematically a scaled sum of the temperatures: 0.5 (To+Tj).

In accordance with one embodiment, the control of the two zones (e.g., inner and outer heaters) can be approximated. The sum of the inner and outer zone thermal powers must equal the total power to be applied to the heater. The difference in power between the inner and outer zones is driven to support a desired temperature uniformity. These can represented mathematically as follows:

$$\begin{bmatrix} P_{total} \\ NU \end{bmatrix} = \begin{bmatrix} 1 & 1 \\ -k & k \end{bmatrix} \begin{bmatrix} P_{inner\_zone} \\ P_{outer\_zone} \end{bmatrix}$$

Both of these power zones can be managed by a servo controller system. In one embodiment, the servo control system may be a multiple-input, multiple-output servo controller. The relationship between thermal power and electrical current is related by the relationship for Joule heating where the resistance of the heater zone is known to be a function of temperature:

$$P_x = i_x^2 R_x(T_x)$$

Separate heater connections, e.g., as shown in FIG. 2 offers mechanical independence of the design, but the functional requirement is only electrical independence. The design of FIGS. 3A-7 maintains electrical independence while making the design mechanically dependent. Although it increases the amperage requirements of the cabling for the common terminal, this is a small cost versus the economic benefit and simplification of this approach. Moreover, this concept is extendible to more than two heater zones, as will be illustrated in FIG. 6.

Referring again to FIG. 3A, the inner voltage setting 276 is found, and then the inner voltage Vi is communicated to the power supply 224 as a direct control setting. The inner voltage setting 276 is then communicated to a ratio calculator 278. The ratio calculator 278 is configured to identify an outer voltage Vo from the determined inner voltage Vi, such that the outer voltage Vo is a ratio (k) of the inner voltage Vo. The power supply 226 receives an open loop control setting that sets the outer voltage Vo, defining the power supply to the outer heater of the pedestal 240.

In one embodiment, the ratio k is set so that the temperature of the pedestal 240 proximate to the inner heater is approximately the same as the temperature of the pedestal 240 proximate to the outer heater. In one embodiment, the ratio is designed to take into account the area over which the inner heater is disposed versus the area over which the outer heater is disposed. Additionally, the ratio will take into account the length of the resistive element Ro versus the length of the resistive element Ri. For example, if the inner zone in which the inner heater is laid out is larger than the outer zone in which the outer heater is laid out, the difference in length of the resistive elements as well as the area of the pedestal 240 that needs to be heated need to be accounted for.

By way of example, it may be the case that the outer zone has an area that is 1.2 times larger than the inner zone, and the ratio will take into account the difference in area when defining the K value. Similarly, differences in length of the resistive elements in the inner zone and the outer zone will also affect the amount of power needed in each of the zones so that the resulting temperature in each of the zones is approximately the same, thus maintaining uniformity across the surface of the pedestal.

In an alternate embodiment, the ratio K may be set dynamically so that the temperature in the inner zone and the outer zone of the pedestal 240 will be different. For instance, by changing the ratio K, it is possible to apply more power or less power to the power supply 226. By way of example, if a process recipe utilized for depositing a material over a substrate would benefit from a slight increase in temperature in the periphery of the substrate, it may be desirable to adjust the K value so that the outer periphery zone provides additional heat than does the inner zone of the pedestal 240. In some embodiments, the dynamic setting of the ratio K can be done in real time by the controller 310, based on input or process parameters being executed. In some embodiments, the ratio value can be preset for different processing stages. In other embodiments, the processing values can be dynamically set for different phases of the deposition process, such as atomic layer deposition steps.

In another embodiment, instead of using two power supplies 224 and 226, it is possible to multiplex a single power supply to n heaters. Thus, due to the thermal mass of each heater zone, the single power supply configuration can simplify the overall system.

Figures 3B, 3C, 3D:
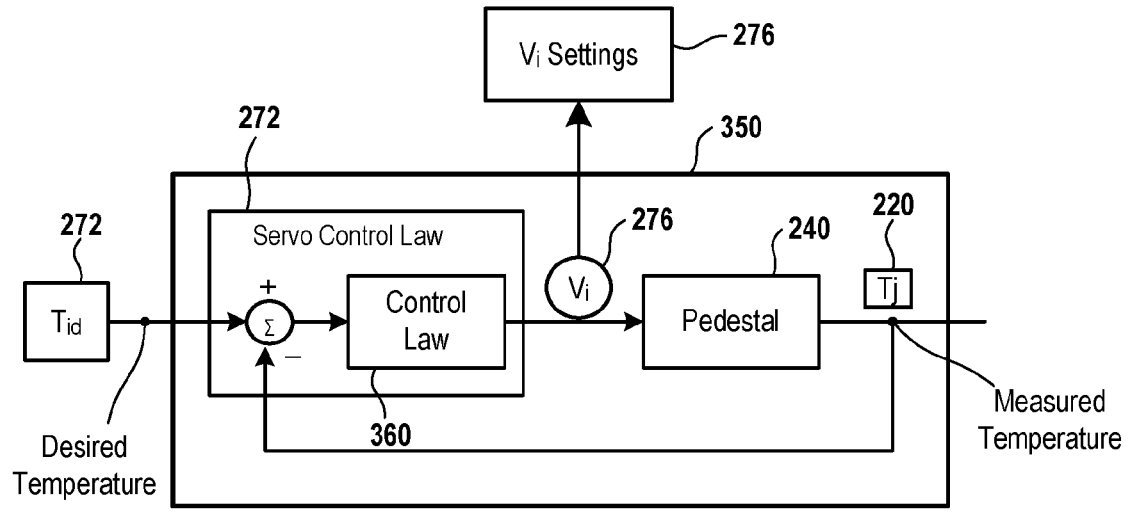
FIG. 3B illustrates an example of a control flow, that processes the servo control law, in accordance with one embodiment.
FIGS. 3C and 3D illustrate examples of difference equations, in accordance with one embodiment.

FIG. 3B illustrates an example of a control flow 350, that processes the servo control law 272, in accordance with one embodiment. In this example, the control flow 350 receives as an input the measured temperature Tj from temperature sensor 220. In the control flow 350, the "j" of "Tj", is an enumeration of j={1, 2, . . . n}. A further input received by the control flow 350 is a desired temperature Tid 272. The servo control law 272 executes a difference operator to execute a difference equation 360. The difference equation 360 produces as the output the inner voltage Vi, since the measured temperature Tj is of the inner heater only. The difference equation is configured to be executed in an iterative manner until the difference between Tid−Tj is zero, wherein Tj is the measured temperature of the inner heater. At that point, the inner voltage Vi will be placed at a setting that ensures that the desired temperature is the same as the measured temperature. In some embodiments, there is some type of power or voltage or current controller that is closed loop on the variables of control flow 350. The examples provided, however, are indicating a practical control law on temperature. Still further, it is also possible to have closed loop control on both zones. A multiple input, multiple output (MIMO) controller may be used wherein the set-point for both zones comprehend servoing the mean temperature as well as a target non-uniformity.

As shown, the output of the inner voltage Vi is provided to the pedestal 240, such that the temperature changes in the area of the pedestal 240 proximate to the inner heater. The inner voltage Vi provided by the inner power supply will therefore continue to change until the measured temperature and the desired temperature are approximately equal. At this point, the inner voltage Vi setting 276 supplied is a direct control setting of the power supply 224 for the inner heater, which establishes that the desired setting is now present proximate to the inner heater of the pedestal 240. The common-terminal heater module 270 will also supply an open loop control setting to communicate the outer voltage Vo to the power supply 226, which is routed to the outer heater of the pedestal 240.

FIG. 3C illustrates an example of the difference equation 360, wherein the first term multiples a constant Kp times the difference Tid−Tj, the second term multiplies a constant Ko times a derivative of the difference Tid−Tj, and the third term multiplies a constant Ki times and integral of the difference Tid−Tj. As noted above, this processing is configured to iterate until the inner voltage Vi produces a temperature of the inner heater that is sensed to be approximately the temperature of the desired temperature for the inner heater. A ratio k is then used to multiply the inner voltage Vi to arrive at the outer voltage Vo, e.g., Vo=kVi. As noted above, the K value for the ratio can be predefined so that the inner heater and the outer heater provide a temperature that is approximately uniform across the surface of the pedestal 240. In some embodiments, the K value can be adjusted so that the outer heater supplies a higher temperature than the inner heater. In some embodiments, the K value can be adjusted so that the outer heater supplies a lower temperature than the inner heater. The control of the K value can be dynamic, or can be predefined for specific recipes.

FIG. 3D illustrates another example of difference equation 360, which is intended to generalize the process to any number of heaters, and not limited to an inner heater and an outer heater. Therefore, the first voltage V1 represents the voltage provided to a first heater, the second voltage V to represents the voltage provided to the second heater. It should be understood that any number of heaters are possible, and therefore the number heaters can be any number with 2 to N. Due to Ohm's Law, $V\_i=R\_i\ i\_i$, so the control system could servo voltage or current.

Figure 4:
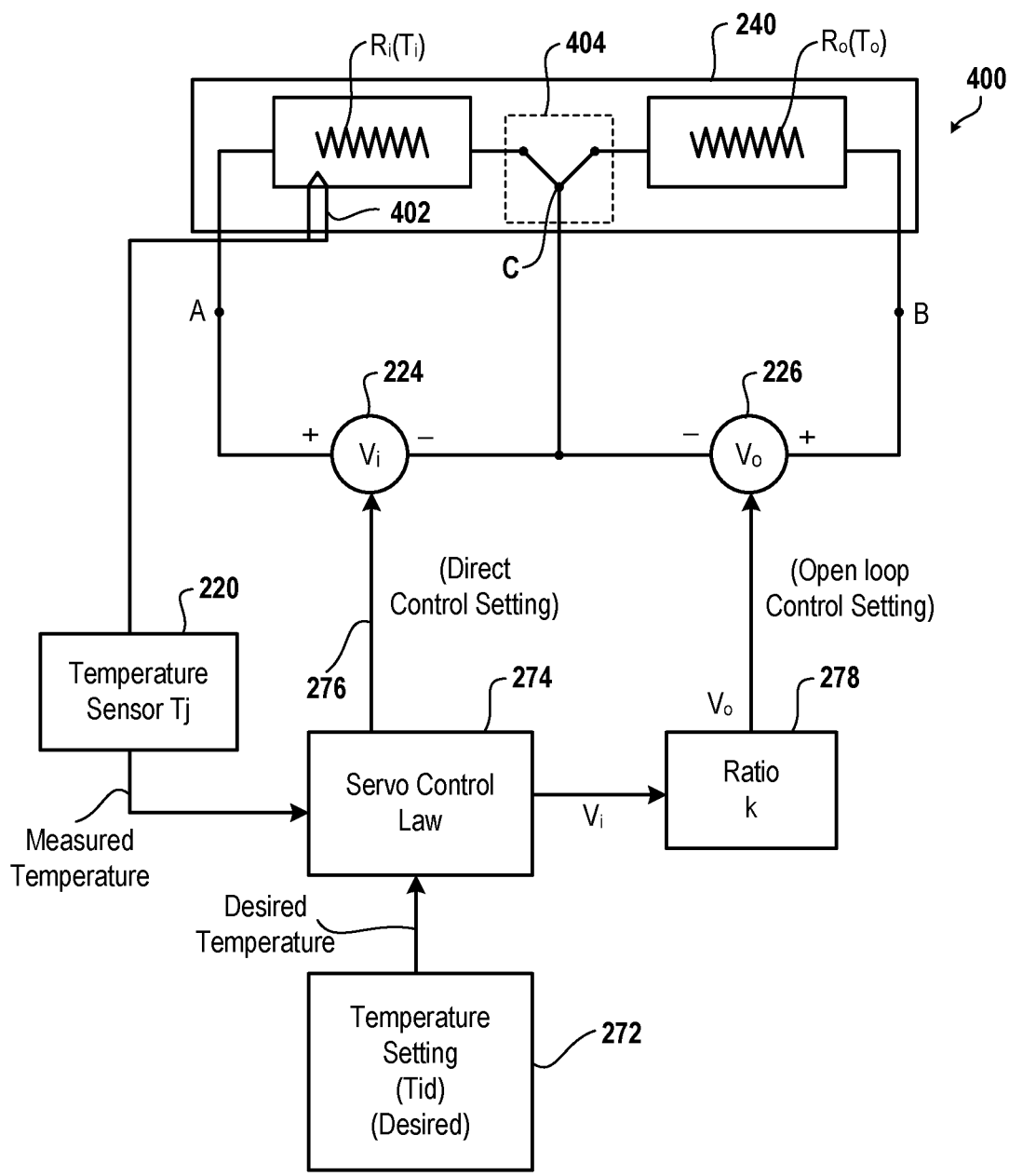
FIG. 4 illustrates a schematic diagram of wiring connections to the inner heater and the outer heater, in accordance with one embodiment.

FIG. 4 illustrates a schematic diagram of wiring connections to the inner heater and the outer heater. As shown, a thermocouple 402 is connected or placed proximate to the inner heater so that the temperature sensor 220 can monitor the temperature of the pedestal proximate to the inner heater. The power supply 224 is shown providing the inner voltage Vi through terminal A to the heater Ri(T), defined by the resistive element Ri. The power supply 226 is shown providing the outer voltage Vo through terminal B to the heater Ro(T), defined by the resistive element Ro. The negative terminals of the power supply 226 and the power supply 224 are respectively coupled to a common terminal C.

As shown, common terminal C, is disposed in the pedestal 240, and the wiring connections for terminal A, terminal B, and common terminal C are the only wiring connections that must be routed into the pedestal for delivering power from power supplies 226 and 224. A joining node is disposed in the electrical connection 404, in the pedestal 240. The servo control law 274 is therefore shown receiving the measured temperature from the temperature sensor 220 and the desired temperature from the temperature settings 272. As mentioned above, the servo control law 274 is therefore configured to generate a direct control setting 276 that sets the inner voltage Vi of the power supply 224. The ratio K is then applied to the input Vi to produce an open control setting that sets the outer voltage Vo of the power supply 226.

Figure 5:
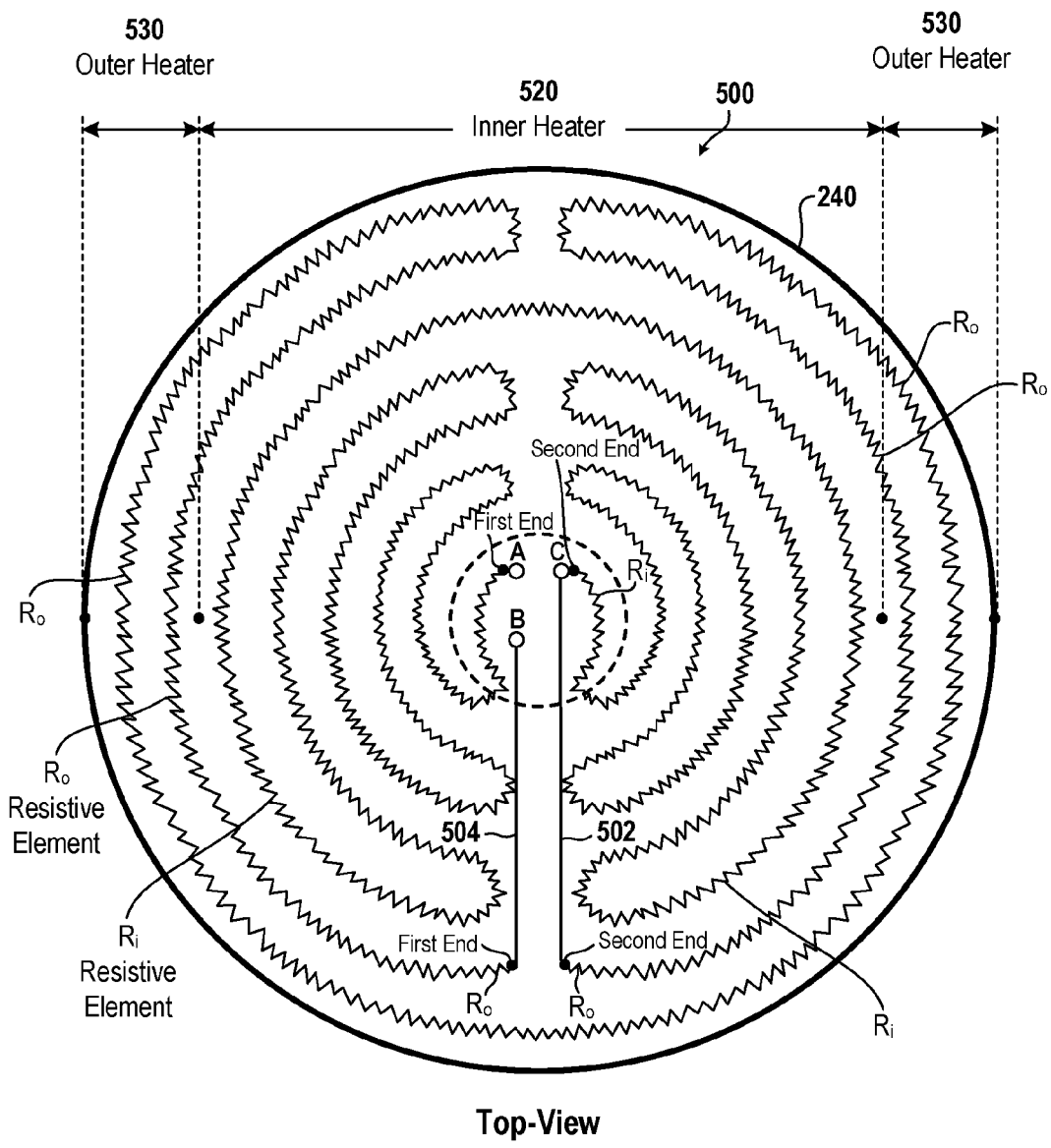
FIG. 5 illustrates one example configuration of the layout of the resistive element Ri of the inner heater, and the layout of the resistive element Ro of the outer heater, in accordance with one embodiment.

FIG. 5 illustrates one example configuration of the layout of the resistive element Ri of the inner heater, and the layout of the resistive element Ro of the outer heater, in accordance with one embodiment. It should be appreciated that the specific layout shown is only one example, and various layout configurations can be provided. Some layout configurations may simply provide continuous circular rings of resistive elements for the inner zone and then continuous circular rings of resistive elements for the outer zone. In other embodiments, multiple heater zones can be provided, such as an inner heater, a middle heater, and an outer heater. In still other embodiments, the heater zones can be oriented in pie shapes, circular oriented heating circles, a grid of individual resistive elements, zigzag resistive elements, or one single resistive element.

In this particular example, the inner heater is defined by resistive element Ri, which is disposed in a diameter 520, and the outer heater is defined by resistive element Ro that surrounds the inner heater in a diameter 530. The inner heater has a resistive element Ri that begins at a first end that is connected to terminal A. The outer heater has a resistive element Ro that begins at a first end that is connected to terminal B via a non-resistive wire 504, that extends to connect the first end of Ri to the terminal A. A second end of the inner heater has a resistive element Ri that is connected to common terminal C. The second end of the outer heater having resistive element Ro is also connected to the common terminal C via a non-resistive wire 502.

The non-resistive wires 502 and 504 are provided to prevent non-uniform concentrations of resistive elements simply to make the connection between the second ends of the inner heater resistive element Ri and the outer heater resistive element Ro. Therefore, the only connections to both the inner and outer heaters disposed on the surface of the pedestal 240 are terminals A, B and C, whereas two separate power supplies 224 and 226 shares the three terminals. As mentioned above, this depiction of the orientation of the resistive elements is provided as an example, and the resistive elements are preferably integrated into the ceramic that defines the pedestal 240, which then receives a substrate for processing thereon.

In one embodiment, the pedestal that is defined from the ceramic material can operate at temperatures up to and greater than 400° C., and may be used with aggressive chemistries.

Figure 6A:
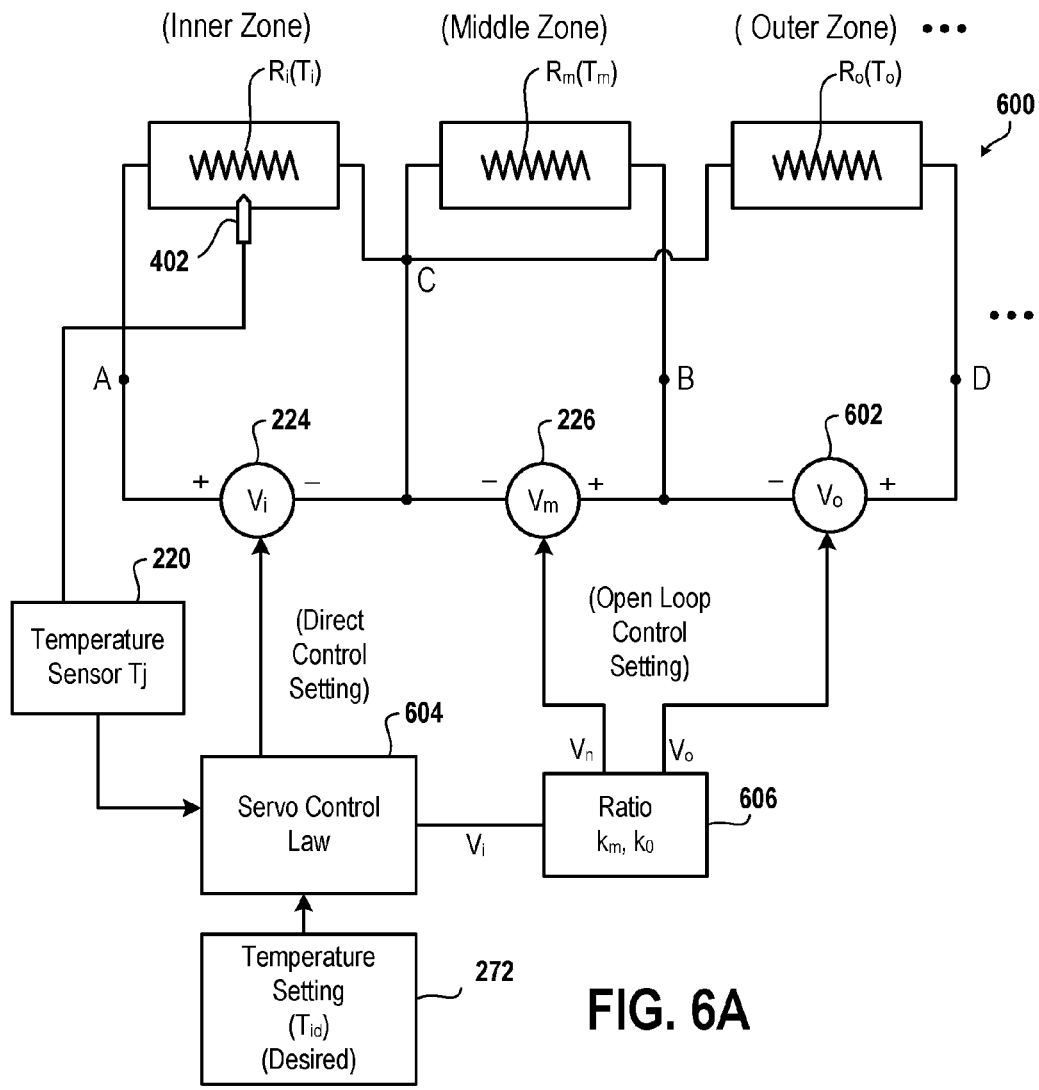
FIG. 6A illustrates another configuration system in which a common terminal C can be shared among three separate heaters, e.g., inner zone, middle zone, outer zone, in accordance with one embodiment.

FIG. 6A illustrates another configuration system 600 in which a common terminal C can be shared among three separate heaters, e.g., inner zone, middle zone, outer zone, in accordance with one embodiment. Three power supplies 224, 226, and 602 are shown. In this example, the negative terminals of each of the heaters will return to common terminal C. The positive terminal of power supply 224 connects to terminal A. The positive terminal of power supply 226 connects to terminal B. The positive terminal of power supply 602 connects to terminal D. In this example, the temperature sensor 220 is configured to sense the temperature of the inner heater using a thermocouple 402. The temperature sensor 220 therefore produces a measured temperature that is fed to the servo control law 604. The desired temperature setting is provided by temperature setting 272 that is also provided to the servo control law 604. The servo control law 604 will therefore produce a direct control setting that establishes the inner voltage Vi. A ratio 606 is then applied to the inner voltage Vi for each of the middle zones and the outer zones using an open loop control setting.

For example, ratio km is used to derive middle voltage Vm supplied to the power supply of the middle zone. The ratio ko is used to derive outer voltage Vo supplied to the power supply of the outer zone. This example has been provided to illustrate that more than two heaters can be used in a pedestal, and wiring to the pedestal can be substantially reduced by utilizing a common terminal C, that is shared among the number of heaters that are powered in a pedestal. In this example, three heaters are being used, and if all wires were separately provided to the pedestal six wires would be required to control the voltage applied to the respective heaters. By utilizing the common terminal C in this example, only for wires would be required to control the voltage applied to the respective heaters.

Figure 6B:
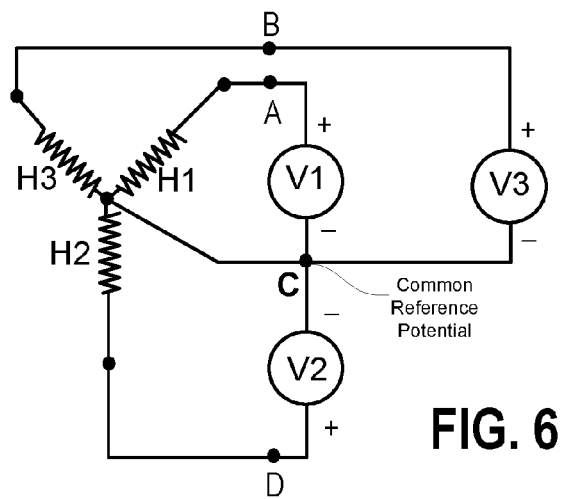
FIG. 6B illustrates another interconnection for providing a common terminal C, in accordance with one embodiment.

FIG. 6B illustrates another embodiment for interconnecting heaters, e.g., three heaters H1, H2, and H3, and using a common reference potential. In this example, N heaters with N+1 terminals are shown. In this configuration, neither one of the N heaters have a floating potential on both terminals, as is the case in FIG. 6A. In this configuration, three heaters H1-H3 still reduce the number of connections from six to four, as each heater does not require two terminal connections routed to the heater itself. In this configuration, a temperature sensor would also be used to measure the temperature of one of the heaters, as is done in FIG. 6A Additionally, the servo control law 604 can operate to receive the measured temperature and the desired temperature for the heater zone that is being measured. Separate ratios k1 and k2, can then be used to set voltages V2 and V3. Thus, the illustration of FIG. 6A is simply provided to show another way of wiring the interconnections between the nodes of the voltage supplies and the heaters to the common reference potential, that operates as the common terminal C.

Figure 7:
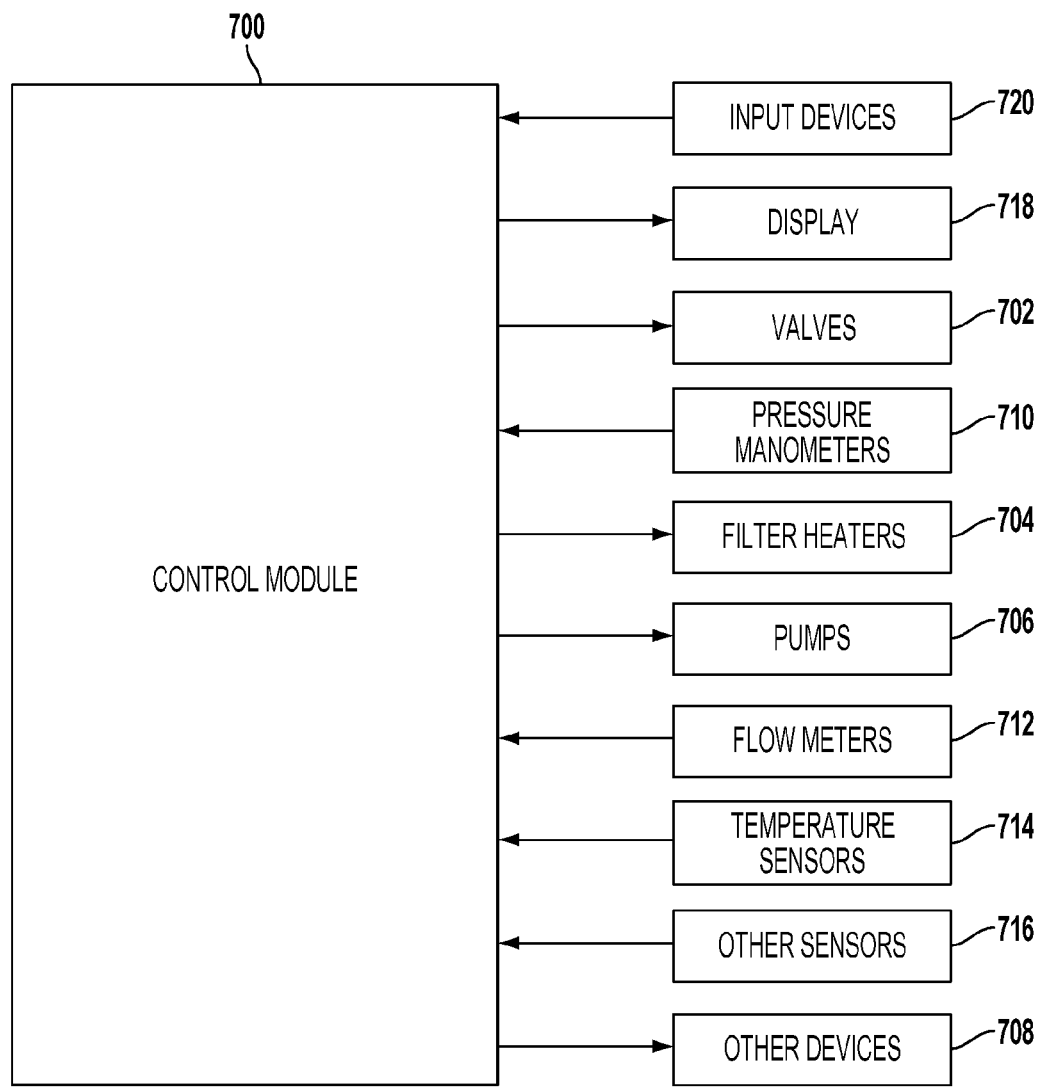
FIG. 7 shows a control module for controlling the systems described above.

FIG. 7 shows a control module 700 for controlling the systems described above. In one embodiment, the control module 110 of FIG. 1A may include some of the example components of controller 310. For instance, the control module 700 may include a processor, memory and one or more interfaces. The control module 700 may be employed to control devices in the system based in part on sensed values. For example only, the control module 700 may control one or more of valves 702, filter heaters 704, pumps 706, and other devices 708 based on the sensed values and other control parameters. The control module 700 receives the sensed values from, for example only, pressure manometers 710, flow meters 712, temperature sensors 714, and/or other sensors 716. The control module 700 may also be employed to control process conditions during precursor delivery and deposition of the film. The control module 700 will typically include one or more memory devices and one or more processors.

The control module 700 may control activities of the precursor delivery system and deposition apparatus. The control module 700 executes computer programs including sets of instructions for controlling process timing, delivery system temperature, and pressure differentials across the filters, valve positions, mixture of gases, chamber pressure, chamber temperature, substrate temperature, RF power levels, substrate chuck or pedestal position, and other parameters of a particular process. The control module 700 may also monitor the pressure differential and automatically switch vapor precursor delivery from one or more paths to one or more other paths. Other computer programs stored on memory devices associated with the control module 700 may be employed in some embodiments.

Typically there will be a user interface associated with the control module 700. The user interface may include a display 718 (e.g. a display screen and/or graphical software displays of the apparatus and/or process conditions), and user input devices 720 such as pointing devices, keyboards, touch screens, microphones, etc.

Computer programs for controlling delivery of precursor, deposition and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the substrate chuck.

Examples of sensors that may be monitored during deposition include, but are not limited to, mass flow control modules, pressure sensors such as the pressure manometers 710, and thermocouples located in delivery system, the pedestal or chuck (e.g. the temperature sensors 714/220). Appropriately programmed feedback and control algorithms may be used with data from these sensors to maintain desired process conditions. The foregoing describes implementation of embodiments of the disclosure in a single or multi-chamber semiconductor processing tool.

In some implementations, a controller is part of a system, which may be part of the above-described examples. Such systems can comprise semiconductor processing equipment, including a processing tool or tools, chamber or chambers, a platform or platforms for processing, and/or specific processing components (a substrate pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, substrate transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor substrate or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" of all or a part of a fab host computer system, which can allow for remote access of the substrate processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet.

The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

What is claimed is:

1. A system for processing a substrate, comprising,
a reactor including a heater assembly for supporting the substrate, the reactor is configured to receive process gases;
an inner heater integrated in the heater assembly;
an outer heater integrated in the heater assembly, the outer heater arranged to surround the inner heater so as to define distinct heater zones;
an inner power supply having a positive terminal connected to a first end of the inner heater and a negative terminal connected to a second end of the inner heater;
an outer power supply having a positive terminal connected to a first end of the outer heater and a negative terminal connected to a second end of the outer heater;
a common terminal connecting the second end of the inner heater to the second end of the outer heater using a wire that extends radially between an outer radius location of the outer heater and an inner radius location of the inner heater where the common terminal is disposed; and
a common-terminal heater module that receives a measured temperature from a region proximate to the inner heater, the common-terminal heater module receives a desired temperature setting and a servo control law is processed to identify a direct control setting of an inner voltage of the inner power supply and an open-loop control setting of an outer voltage for the outer power supply, wherein the outer voltage is defined as a ratio of the inner voltage, wherein the common-terminal heater module proportions the ratio to compensate for a difference in a length of a resistive element used to define the inner heater and a resistive element used to define the outer heater.

2. The system of claim 1, wherein the servo control law processes a closed loop analysis of a difference between the desired temperature and the measured temperature from the inner heater.

3. The system of claim 2, wherein the closed loop analysis is configured to iterate until the measured temperature is equal to the desired temperature; the closed loop analysis is configured to identify the inner voltage of the inner power supply that is used as the direct control setting.

4. The system of claim 1, wherein the ratio is selected to cause the outer heater to approximately reach the desired temperature setting, such that approximate uniformity in temperature across the inner heater and outer heater is provided for processing the substrate when disposed over the heater assembly of the reactor.

5. The system of claim 1, wherein a resistive value of each resistive element defining each of the inner and outer heaters changes as a function of temperature.

6. The system of claim 1, wherein each of,
the negative terminal of the inner power supply,
the negative terminal of the outer power supply, the second end of the inner heater; and
the second end of the outer heater,
are connected to a joining node of the common terminal.

7. The system of claim 6, wherein the common terminal reduces connections from both the inner power supply and the outer power supply, such that the inner heater is a first heater zone and the outer heater is a second heater zone, wherein the common terminal reduces connections from n heater zones to n+1 connections.

8. The system of claim 6, wherein the second end of the inner heater and the second end of the outer heater are electrically connected at the joining node of the common terminal.

9. The system of claim 1, further comprising,
a temperature sensor disposed in the heater assembly proximate to the inner heater is used to obtain the measured temperature of the heater assembly in a vicinity of the inner heater, the heater assembly being defined from a ceramic material, said resistive elements of the inner heater and the outer heater are configured to change their resistive value as a function of temperature.

10. The system of claim 9, wherein the common terminal is defined outside of the heater assembly, such that the inner heater and the outer heater are controlled by three connections made to the inner power supply and the outer power supply.

11. The system of claim 1, wherein the proportion of the ratio further compensates for a difference in area of the heater assembly that includes the resistive element of the outer heater verses the resistive element of the inner heater.

12. The system of claim 1, wherein the ratio is predefined to achieve a substantially uniform heat profile across a surface of the heater assembly, wherein the direct control setting of the inner voltage of the inner power supply is identified using a temperature sensor disposed in the heater assembly proximate to the inner heater to identify the measured temperature and no temperature sensor is used to measure temperature proximate to the outer heater.

13. The system of claim 1, wherein the ratio is settable by a controller of the reactor, wherein specific settings of the ratio achieve differences in heat profiles of the heater assembly produced by the outer heater verses the inner heater, wherein the direct control setting of the inner voltage of the inner power supply is identified using a temperature sensor disposed in the heater assembly proximate to the inner heater to identify the measured temperature and no temperature sensor is used to measure temperature proximate to the outer heater.

14. The system of claim 1, wherein the heater assembly is one of a pedestal or a showerhead of the reactor.

15. A method for controlling heater zones of a heater assembly used in a reactor implemented for processing substrates, comprising,
connecting a first terminal of a first power supply to a first end of an inner heater of the heater assembly;
connecting a first terminal of a second power supply to a first end of an outer heater of the heater assembly;
connecting a second end of the inner heater to a second end of the outer heater via a common terminal using a wire that extends radially between an outer radius location of the outer heater and an inner radius location of the inner heater where the common terminal is disposed;
connecting a second terminal of the first power supply and a second terminal of the second power supply to the common terminal, wherein the inner and outer heaters of the heater assembly are controlled with the first terminal of the first power supply, the first terminal of the second power supply, and the common terminal;
obtaining a measured temperature of the heater assembly proximate to the inner heater;
processing a servo control law to identify a direct control setting of an inner voltage of the first power supply so that a desired temperature matches the measured temperature; and
identifying an open-loop control setting of an outer voltage of the second power supply, the outer voltage being a multiple of the inner voltage, the multiple defined by a ratio, and
proportioning the ratio to compensate for a difference in a length of a resistive element used to define the inner heater and a resistive element used to define the outer heater.

16. The method of claim 15, wherein connections to the heater assembly for the inner and outer heaters is limited to,
the first terminal of the first power supply,
the first terminal of the second power supply, and
the common terminal, wherein the common terminal is shared by the first and second power supplies.

17. The method of claim 15, wherein processing the servo control law includes executing a closed loop analysis of a difference between the desired temperature and the measured temperature from the inner heater.

18. The method of claim 17, wherein the closed loop analysis is configured to iterate until the measured temperature is equal to the desired temperature, the closed loop analysis is configured to identify the direct control setting of the inner voltage of the first power supply.

19. The method of claim 15, wherein the ratio is selected to cause the outer heater to approximately reach the desired temperature setting, such that approximate uniformity in temperature across the inner heater and outer heater is provided for processing the substrate when disposed over the heater assembly of the reactor.

20. The method of claim 15, wherein the ratio is settable by a controller of the reactor, wherein specific settings of the ratio achieve differences in heat profiles of the heater assembly produced by the outer heater verses the inner heater, wherein the direct control setting of the inner voltage of the inner power supply is identified using a temperature sensor disposed in the heater assembly proximate to the inner heater to identify the measured temperature and no temperature sensor is used to measure temperature proximate to the outer heater.

21. A system for processing a substrate, comprising,
a reactor including a heater assembly for supporting the substrate;
two or more heaters integrated into the heater assembly, the two or more heaters include a first heater and a second heater, a first end of the first heater connected to a first terminal of an inner power supply and a second terminal of the inner power supply connected to a common terminal, a first end of the second heater connected to a first terminal of an outer power supply and a second terminal of the outer power supply connected to the common terminal;
the common terminal connecting a second end of the first heater to a second end of the second heater using a wire that extends radially between an outer radius location of the outer heater and an inner radius location of the inner heater where the common terminal is disposed; and a common-terminal heater module that receives a measured temperature that is proximate to the first heater of the heater assembly, the common-terminal heater module receives to receive a desired temperature setting and a servo control law is processed to identify a direct control setting of a first voltage for the first heater and an open-loop control setting of a second voltage for the second heater is derived as a ratio of the first voltage, wherein the common-terminal heater module proportions the ratio to compensate for a difference in a length of a resistive element used to define the first heater and a resistive element used to define the second heater.

22. The system of claim 21, wherein a resistive value of each resistive element defining each of the two or more heaters changes as a function of temperature.

23. The system of claim 22, wherein a measurement of the resistive value indicates a temperature of a zone associated with the respective resistive element.

\* \* \* \* \*